(12) United States Patent
Tanaka

(10) Patent No.: US 9,718,670 B2
(45) Date of Patent: Aug. 1, 2017

(54) FUNCTIONAL DEVICE, ELECTRONIC APPARATUS, AND MOVING OBJECT

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/329,109

(22) Filed: Jul. 11, 2014

(65) Prior Publication Data

US 2015/0021719 A1    Jan. 22, 2015

(30) Foreign Application Priority Data

Jul. 17, 2013  (JP) .................. 2013-148615

(51) Int. Cl.
*H01L 29/84*   (2006.01)
*B81B 3/00*    (2006.01)

(52) U.S. Cl.
CPC .......... *B81B 3/0021* (2013.01); *B81B 3/0013* (2013.01); *B81B 3/0051* (2013.01); *B81B 2201/0235* (2013.01); *B81B 2201/0242* (2013.01)

(58) Field of Classification Search
CPC .............................. H01L 2924/1461
See application file for complete search history.

(56) References Cited

U.S. PATENT DOCUMENTS

| | | |
|---|---|---|
| 5,511,420 A | 4/1996 | Zhao et al. |
| 5,542,295 A | 8/1996 | Howe et al. |
| 5,574,222 A | 11/1996 | Offenberg |
| 5,627,317 A | 5/1997 | Offenberg et al. |
| 6,065,341 A | 5/2000 | Ishio et al. |
| 6,170,332 B1 | 1/2001 | MacDonald et al. |
| 6,171,881 B1 | 1/2001 | Fujii |
| 6,240,782 B1 | 6/2001 | Kato et al. |
| 6,272,926 B1 | 8/2001 | Fehrenbach et al. |
| 6,276,207 B1 | 8/2001 | Sakai et al. |
| 6,360,604 B1 | 3/2002 | Laermer et al. |
| 6,360,605 B1 | 3/2002 | Pinter et al. |
| 6,388,300 B1 | 5/2002 | Kano et al. |
| 6,494,096 B2 | 12/2002 | Sakai et al. |
| 6,568,267 B2 | 5/2003 | Chida et al. |
| 6,634,232 B1 | 10/2003 | Rettig et al. |
| 6,763,716 B2 | 7/2004 | Nagahara et al. |

(Continued)

FOREIGN PATENT DOCUMENTS

| | | |
|---|---|---|
| JP | 05-304303 A | 11/1993 |
| JP | 07-333078 A | 12/1995 |

(Continued)

*Primary Examiner* — Eugene Lee
(74) *Attorney, Agent, or Firm* — Harness, Dickey & Pierce, P.L.C.

(57) ABSTRACT

A functional device includes a movable body displaceable along a first axis, a fixed section configured to support the movable body in a coupling section, a movable electrode section extending from the movable body, a fixed electrode section arranged to be opposed to the movable electrode section, and an extending section extending from the fixed section and including an opposed section opposed to a side surface of the movable electrode section. The distance between the opposed section and the movable electrode section is smaller than the distance between the fixed electrode section and the movable electrode section.

19 Claims, 13 Drawing Sheets

(56) References Cited

U.S. PATENT DOCUMENTS

| | | |
|---|---|---|
| 6,892,577 B2 | 5/2005 | Nagahara |
| 6,960,488 B2 | 11/2005 | Brosnihan et al. |
| 7,243,545 B2 | 7/2007 | Sakai et al. |
| 7,267,006 B2 | 9/2007 | Malvern |
| 7,418,864 B2 | 9/2008 | Asami et al. |
| 7,469,588 B2 | 12/2008 | LaFond et al. |
| 7,554,340 B2 | 6/2009 | Furukubo et al. |
| 7,900,515 B2 | 3/2011 | Yamaguchi et al. |
| 8,289,723 B2 * | 10/2012 | Inoue et al. ................... 361/760 |
| 8,516,891 B2 | 8/2013 | Zhang et al. |
| 8,997,569 B2 * | 4/2015 | Narita et al. ............... 73/514.01 |
| 2001/0025529 A1 | 10/2001 | Murata et al. |
| 2002/0011107 A1 | 1/2002 | Sakai et al. |
| 2002/0112538 A1 | 8/2002 | Pinter et al. |
| 2003/0217597 A1 | 11/2003 | Kumagai et al. |
| 2004/0017209 A1 | 1/2004 | Goto |
| 2004/0187571 A1 | 9/2004 | Goto |
| 2004/0187575 A1 | 9/2004 | Murata et al. |
| 2005/0061075 A1 | 3/2005 | Sugiura |
| 2006/0008935 A1 | 1/2006 | Asai |
| 2006/0107742 A1 | 5/2006 | Sakai |
| 2009/0277267 A1 | 11/2009 | Wang et al. |
| 2010/0050771 A1 * | 3/2010 | Je et al. ...................... 73/514.32 |
| 2010/0072563 A1 * | 3/2010 | Sato et al. ..................... 257/415 |
| 2011/0120221 A1 * | 5/2011 | Yoda ........................... 73/514.32 |
| 2011/0290023 A1 * | 12/2011 | Takagi ........................ 73/514.32 |
| 2012/0111615 A1 | 5/2012 | Yoda et al. |
| 2013/0074596 A1 * | 3/2013 | Takizawa ................... 73/504.12 |
| 2014/0216156 A1 * | 8/2014 | Sakai .......................... 73/514.32 |
| 2015/0301075 A1 * | 10/2015 | Yamanaka et al. ........ 73/514.32 |

FOREIGN PATENT DOCUMENTS

| | | |
|---|---|---|
| JP | 08-43436 A | 2/1996 |
| JP | 08-506857 A | 7/1996 |
| JP | 11-230985 A | 8/1999 |
| JP | 2000-206142 A | 7/2000 |
| JP | 2000-286430 A | 10/2000 |
| JP | 2001-330623 A | 11/2001 |
| JP | 2002-005954 A | 1/2002 |
| JP | 2002-510139 A | 4/2002 |
| JP | 2004-286615 A | 10/2004 |
| JP | 2004-286624 A | 10/2004 |
| JP | 2007-279056 A | 10/2007 |
| JP | 2011-247714 A | 12/2011 |
| JP | 2012-098208 A | 5/2012 |
| JP | 2012-163415 A | 8/2012 |
| WO | WO-94-18697 A1 | 8/1994 |
| WO | WO-99-36941 A2 | 7/1999 |

* cited by examiner

FUNCTIONAL DEVICE, ELECTRONIC APPARATUS, AND MOVING OBJECT

CROSS-REFERENCE TO RELATED APPLICATIONS

This application claims priority to Japanese Patent Application No. 2013-148615 filed on Jul. 17, 2013. The entire disclosure of Japanese Patent Application No. 2013-148615 is hereby incorporated herein by reference.

BACKGROUND

1. Technical Field

The present invention relates to a functional device, an electronic apparatus, and a moving object.

2. Related Art

In recent years, a physical quantity sensor (a functional device) has been developed that detects a physical quantity such as acceleration using, for example, a silicon MEMS (Micro Electro Mechanical Systems) technique.

For example, JP-A-2012-98208 (Patent Literature 1) describes a physical quantity sensor including a movable body provided above a substrate, a movable electrode section extending from the movable body, a first fixed electrode section provided on one side of the movable electrode section, and a second fixed electrode section provided on the other side of the movable electrode section. The physical quantity sensor separately measures capacitance between the movable electrode section and the first fixed electrode section and capacitance between the movable electrode section and the second fixed electrode section and detects a physical quantity (acceleration) on the basis of a result of the measurement.

However, in the physical quantity sensor described in Patent Literature 1, for example, when excessive acceleration is applied, it is likely that the movable electrode section collides with the fixed electrode sections and the movable electrode section and the fixed electrode section are damaged. Further, in the physical quantity sensor described in Patent Literature 1, the potential of the movable electrode section and the potential of the fixed electrode sections are different. Therefore, when the movable electrode section is displaced, it is likely that the movable electrode section adheres to the fixed electrode sections.

SUMMARY

An advantage of some aspects of the invention is to provide a functional device that can accurately detect a physical quantity. An advantage of some aspects of the invention is to provide an electronic apparatus and a moving object including the functional device.

The invention can be implemented as the following forms or application examples.

APPLICATION EXAMPLE 1

A functional device according to this application example includes: a movable body displaceable along a first axis; a fixed section configured to support the movable body in a coupling section; a movable electrode section extending from the movable body; a fixed electrode section arranged to be opposed to the movable electrode section; and an extending section extending from the fixed section and including an opposed section opposed to a side surface of the movable electrode section. The distance between the opposed section and the movable electrode section is smaller than the distance between the fixed electrode section and the movable electrode section.

In the functional device, when a force in a −X-axis direction acts on the movable body because of excessive acceleration, the movable electrode section (a first movable electrode finger) collides with the opposed section before the movable electrode (a second movable electrode finger) collides with the fixed electrode section. Therefore, in the functional device, it is possible to reduce damage to the movable electrode section and the fixed electrode section.

Further, in the functional device, since the extending section extends from the fixed section, the opposed section can have potential equal to the potential of the movable electrode section. Therefore, when the movable electrode section collides with the opposed section, it is possible to reduce adhesion of the movable electrode section to the opposed section.

Further, in the functional device, for example, after a silicon substrate is etched and the movable body, the movable electrode section, and the extending section are formed, it is possible to reduce adhesion of the movable electrode section to the opposed section.

Consequently, the functional device can accurately detect a physical quantity (acceleration) and secure reliability.

APPLICATION EXAMPLE 2

In the functional device according to this application example, a plurality of the movable electrode sections may be provided along the first axis, and the distance between the opposed section and the movable electrode section opposed to the opposed section may be smaller than the distance between the fixed electrode section and the other movable electrode sections.

In the functional device described above, it is possible to accurately detect a physical quantity.

APPLICATION EXAMPLE 3

In the functional device according to this application example, a plurality of the movable electrode sections may be provided along the first axis, and the width of the movable electrode section opposed to the opposed section may be larger than the width of the other movable electrode sections.

In the functional device described above, the movable electrode section opposed to the opposed section can have high rigidity compared with the other movable electrode sections. Therefore, in the functional device, when the movable electrode section opposed to the opposed section collides with the opposed section, it is possible to reduce damage to the movable electrode section opposed to the opposed section.

APPLICATION EXAMPLE 4

In the functional device according to this application example, a protrusion section may be provided in at least one of the opposed section of the extending section and a portion of the movable electrode section opposed to the opposed section.

In the functional device described above, compared with a form in which the protrusion section is not provided, it is possible to reduce a contact area between the movable electrode section and the opposed section. Consequently, it is possible to reduce adhesion of the movable electrode section to the opposed section.

APPLICATION EXAMPLE 5

In the functional device according to this application example, the extending section may include: a first portion extending from the fixed section along a second axis that crosses the first axis; and a second portion extending from the first portion in the direction of the first axis and including the opposed section at an end.

The functional device described above can accurately detect a physical quantity.

APPLICATION EXAMPLE 6

In the functional device according to this application example, the fixed section, the extending section, the coupling section, the movable electrode section, and the movable body may be integrally provided.

In the functional device described above, for example, by machining one silicon substrate, it is possible to integrally form the fixed section, the extending section, the coupling section, the movable electrode section, and the movable body.

APPLICATION EXAMPLE 7

In the functional device according to this application example, the extending section may include a portion opposed to a distal end face of the movable electrode section.

In the functional device described above, when a force in a direction crossing the first axis acts on the movable body because of excess acceleration, for example, the movable electrode section can collide with the first opposed section before the movable body collides with the fixed electrode section. Therefore, in the functional device, it is possible to reduce damage to the movable body and the fixed electrode section.

APPLICATION EXAMPLE 8

In the functional device according to this application example, the coupling section may include: a first coupling section arranged on one side across the first axis; and a second coupling section arranged on the other side, and the movable body may be provided to extend between the first coupling section and the second coupling section.

In the functional device described above, it is possible to increase the mass of the movable body. As a result, when acceleration is applied, it is possible to increase a force acting on the movable body. That is, in the functional device, it is possible to increase the mass of the movable body making use of a space between two beams.

Further, in the functional device described above, for example, when a silicon substrate is dry-etched to form the coupling section, it is possible to equalize etching speed. As a result, it is possible to highly accurately form the coupling section. It is possible to impart a desired characteristic (a designed characteristic) to the functional device.

APPLICATION EXAMPLE 9

In the functional device according to this application example, the distance between an end of an extending portion of the movable body and an end of the fixed section may be set smaller than the distance between the fixed electrode section and the movable electrode section.

In the functional device described above, the movable body collides with the fixed section before the movable electrode section (the second movable electrode finger) collides with the fixed electrode section. Therefore, in the functional device, it is possible to reduce damage to the movable electrode section and the fixed electrode section.

APPLICATION EXAMPLE 10

In the functional device according to this application example, the movable electrode section may include: a first movable electrode section extending from one end of the movable body along a second axis that crosses the first axis; and a second movable electrode extending from the other end on the opposite side of the one end. The functional device may further include: a first extending section extending from the fixed section and including a first opposed section opposed to a side surface of the first movable electrode section; and a second extending section extending from the fixed section and including a second opposed section opposed to a side surface of the second movable electrode section.

In the functional device described above, it is possible to reduce rotation of the movable body.

APPLICATION EXAMPLE 11

In the functional device according to this application example, the fixed section may include a first fixed section and a second fixed section, the movable body may be supported by the first fixed section and the second fixed section in the coupling section, and the movable electrode section may include: a first movable electrode section extending from one end of the movable body along a second axis that crosses the first axis; and a second movable electrode section extending from the other end on the opposite side of the one end. The functional device may further include: a first extending section functioning as the extending section, the first extending section extending from the first fixed section and including a first opposed section opposed to a side surface of the first movable electrode; and a third extending section functioning as the extending section, the third extending section extending from the second fixed section in an opposite direction of the first extending section and including a third opposed section opposed to a side surface of the second movable electrode section.

In the functional device described above, it is possible to reduce rotation of the movable body.

APPLICATION EXAMPLE 12

An electronic apparatus according to this application example includes the functional device according to any one of the application examples 1 to 11.

In the electronic apparatus, since the electronic apparatus includes the functional device according to the application example, the electronic apparatus can accurately detect a physical quantity.

APPLICATION EXAMPLE 13

A moving object according to this application example includes the functional device according to any one of the application examples 1 to 11.

In the moving object, since the moving object includes the functional device according to this application example, the moving object can accurately detect a physical quantity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention are explained in detail below with reference to the drawings. The embodiments explained below do not unduly limit contents of the invention described in the appended claims. All components explained below are not always essential constituent elements of the invention.

1. First Embodiment
1.1. Functional Device

Figure 1:
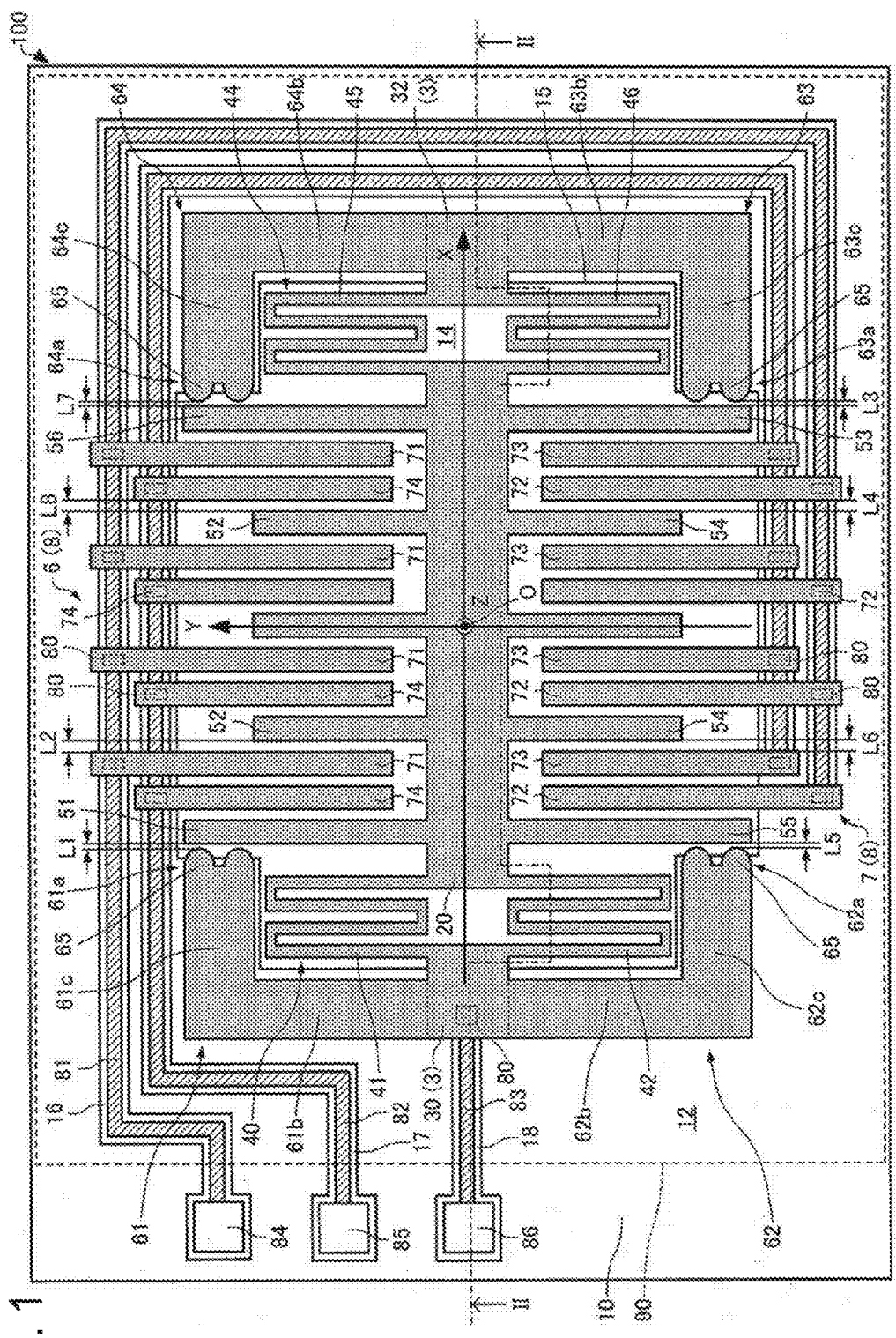
FIG. 1 is a plan view schematically showing a physical quantity sensor according to a first embodiment.
Figure 2:
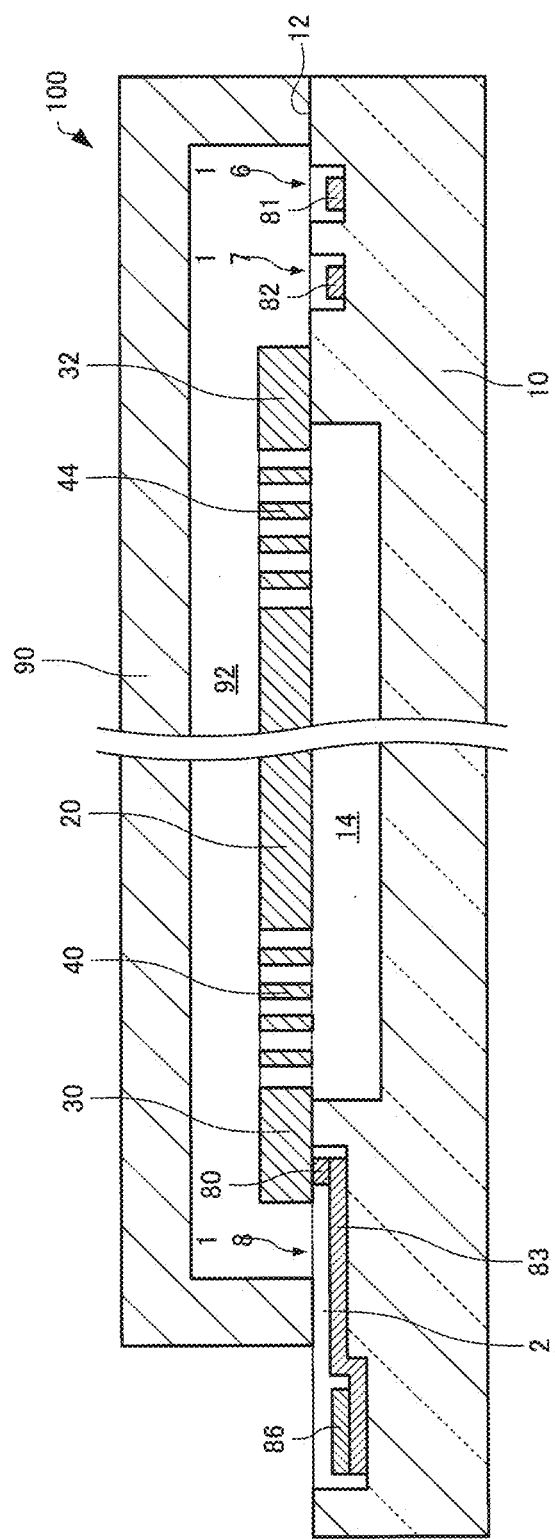
FIG. 2 is a sectional view schematically showing the physical quantity sensor according to the first embodiment.

First, a functional device according to a first embodiment is explained with reference to the drawings. FIG. 1 is a plan view schematically showing a functional device 100 according to the first embodiment. FIG. 2 is a II-II line sectional view of FIG. 1 schematically showing the functional device 100 according to the first embodiment.

For convenience, in FIG. 1, a lid body 90 is seen through. In FIG. 1, as three axes orthogonal to one another, an X axis (a first axis), a Y axis (a second axis), and a Z axis are shown. In the following explanation, the origin of the X axis, the Y axis, and the Z axis is a center O of a movable body 20 (e.g., the center of the movable body 20 on a plane). In the following explanation, a first direction along the first axis is represented as −X-axis direction, a second direction along a second axis that crosses the first axis is represented as +Y-axis direction, a third direction opposite to the first direction is represented as +X-axis direction, and a fourth direction opposite to the second direction is represented as −Y-axis direction.

The functional device 100 includes, as shown in FIGS. 1 and 2, a substrate 10, a movable body 20, a fixed section 3 including a first fixed section 30 and a second fixed section 32, first and second coupling sections 40 and 44, a movable electrode section 8 including a first movable electrode section 6 and a second movable electrode section 7, first to fourth extending sections 61, 62, 63, and 64, first to fourth fixed electrode sections 71, 72, 73, and 74, first to third wires 81, 82, and 83, first to third pads 84, 85, and 86, and the lid body 90. In the following explanation, the functional device 100 is a physical quantity sensor. Specifically, in an example explained below, the functional device 100 is an acceleration sensor (a capacitance-type MEMS acceleration sensor) that detects acceleration in the horizontal direction (a direction along the X axis (the X-axis direction)).

The material of the substrate 10 is, for example, glass or silicon. A recess 14 is formed on an upper surface 12 (a surface facing the +Z-axis direction) of the substrate 10. The movable body 20, the coupling sections 40 and 44, and the movable electrode section 8 are provided above the recess 14 via a gap. Because the recess 14 is formed, the movable 20 can move in a predetermined direction without coming into contact with the substrate 10. A plane shape (a shape viewed from the Z-axis direction) of the recess 14 is not particularly limited as long as the recess 14 does not overlap the movable body 20, the coupling sections 40 and 44, and the movable electrode section 8. First to third groove sections 16, 17, and 18 are formed on the upper surface 12 of the substrate 10. The wires 81, 82, and 83 and the pads 84, 85, and 86 are provided in the groove sections 16, 17, and 18.

In an example shown in FIG. 2, side surfaces of the recess 14 and the groove sections 16, 17, and 18 (surfaces of the substrate 10 defining the recess 14 and the groove sections 16, 17, and 18) are perpendicular to the upper surface 12. However, the side surfaces of the recess 14 and the groove sections 16, 17, and 18 may be inclined with respect to the upper surface 12.

The movable body 20, the fixed sections 30 and 32, the coupling sections 40 and 44, the movable electrode section 8, and the extending sections 61 to 64 are integrally formed. The material of the movable body 20, the fixed sections 30 and 32, the coupling sections 40 and 44, the movable electrode sections 8, and the extending sections 61 to 64 is, for example, silicon imparted with electrical conductivity by being doped with impurities such as phosphorous or boron. The movable body 20, the fixed sections 30 and 32, the coupling sections 40 and 44, the movable electrode section 8, and the extending sections 61 to 64 are electrically connected to each other and can have equal potential.

The movable body 20 is displaceable in the X-axis direction (the +X-axis direction and the −X-axis direction) (along the X-axis). Specifically, the movable body 20 is displaced in the X-axis direction while elastically deforming the coupling sections 40 and 44 according to acceleration in the X-axis direction. According to such displacement, the sizes of gaps between the movable electrode section 8 and the fixed electrode sections 71 to 74 change. That is, according to such displacement, the magnitudes of capacitances between the movable electrode section 8 and the fixed electrode sections 71 to 74 change. The functional device 100 detects the acceleration in the X-axis direction on the basis of the capacitances. In an example shown in FIG. 1, a plane shape of the movable body 20 is a rectangle having a long side extending along the X axis.

The fixed sections 30 and 32 are joined and fixed to the substrate 10. The fixed sections 30 and 32 support the movable body 20 in the coupling sections 40 and 44 (via the coupling sections 40 and 44). The first fixed section 30 is located in the −X-axis direction of the movable body 20 in plan view (when viewed from the Z-axis direction). The second fixed section 32 is located in the +X-axis direction of the movable body 20 in plan view. That is, the fixed sections 30 and 32 and the movable body 20 are arranged in the order of the first fixed section 30, the movable body 20, and the second fixed section 32 in the +X-axis direction. The fixed sections 30 and 32 support the movable body 20 via the coupling sections 40 and 44. The fixed sections 30 and 32 are provided extending across an outer edge 15 of the recess 14 in plan view. In the example shown in the figure, a plane shape of the fixed sections 30 and 32 is a rectangle.

The coupling section 40 couples the movable body 20 and the first fixed section 30. The coupling section 44 couples the movable body 20 and the second fixed section 32. The coupling sections 40 and 44 have a predetermined spring constant and are configured to be capable of displacing the movable body 20 in the X-axis direction. In the example shown in the figure, the coupling section 40 is configured by a first coupling section (beam) 41 and a second coupling section (beam) 42 formed in a shape extending in the X-axis direction while being laid back and forth in the Y-axis direction. The beam 41 is arranged on one side across the X axis. The beam 42 is arranged on the other side across the X axis. The coupling section 44 is configured by a first coupling section (beam) 45 and a second coupling section (beam) 46 formed in a shape extending in the X-axis direction while being laid back and forth in the Y-axis direction. The beam 45 is arranged on one side across the X axis. The beam 46 is arranged on the other side across the X axis.

A plurality of the first movable electrode sections 6 are provided along the X axis. The first movable electrode section 6 extends from the movable body 20 in the +Y-axis direction. That is, the first movable electrode section 6 extends from one end of the movable body 20 along the Y axis. The first movable electrode section 6 includes first, second, and sixth movable electrode fingers 51, 52, and 56. The movable electrode fingers 51, 52, and 56 are arranged in the order of the first movable electrode finger 51, the second movable electrode finger 52, and the sixth movable electrode finger 56 in the +X-axis direction. The first movable electrode finger 51 is a movable electrode finger located most distant in the −X-axis direction among the movable electrode fingers extending from the movable body 20 in the +Y-axis direction. The sixth movable electrode finger 56 is a movable electrode finger located most distant in the +X-axis direction among the movable electrode fingers extending from the movable body 20 in the +Y-axis direction. In the example shown in the figure, three second movable electrode fingers 52 are provided. However, the number of the second movable electrode fingers 52 is not particularly limited.

A plurality of the second movable electrode sections 7 are provided along the X axis. The second movable electrode section 7 extends from the movable body 20 in the −Y-axis direction. That is, the second movable electrode section 7 extends from the other end on the opposite direction of one end of the movable body 20 along the Y axis. The second movable electrode section 7 includes third to fifth movable electrode fingers 53, 54, and 55. The movable electrode fingers 53, 54, and 55 are arranged in the order of the fifth movable electrode finger 55, the fourth movable electrode finger 54, and the third movable electrode finger 53 in the +X-axis direction. The fifth movable electrode finger 55 is a movable electrode finger located most distant in the −X-axis direction among the movable electrode fingers extending from the movable body 20 in the −Y-axis direction. The third movable electrode finger 53 is a movable electrode finger located most distant in the +X-axis direction among the movable electrode fingers extending from the movable body 20 in the −Y-axis direction. In the example shown in the figure, three fourth movable electrode fingers 54 are provided. However, the number of the fourth movable electrode fingers 54 is not particularly limited.

The widths (the sizes on the X-axis direction) of the movable electrode fingers 51 to 56 are, for example, equal to one another. The lengths (the sizes in the Y-axis direction) of the movable electrode fingers 51, 53, 55, and 56 are, for example, larger than the lengths of the movable electrode fingers 52 and 54. In the example shown in the figure, a plane shape of the movable electrode fingers 51 to 56 is a rectangle having a long side extending along the Y axis.

The third movable electrode finger 53 may be provided point-symmetrically to the first movable electrode finger 51 with respect to the center of the movable body 20 (e.g., the center of the movable body 20 on a plane). The fourth movable electrode finger 54 may be provided point-symmetrically to the second movable electrode finger 52 with respect to a center C. The fifth movable electrode finger 55 may be provided line-symmetrically to the first movable electrode finger 51 with respect to the X axis that passes the center C. The sixth movable electrode finger 56 may be provided line-symmetrically to the third movable electrode finger 53 with respect to the X axis that passes the center C.

The first extending section 61 extends from the fixed section 3 and includes a first opposed section 61a opposed to a side surface of the movable electrode section 8. Specifically, the first extending section 61 extends from the first fixed section 30. The first extending section 61 includes the first opposed section 61a. The first opposed section 61a is located in the −X-axis direction of the first movable electrode finger 51 and opposed to a side surface of the first movable electrode finger 51. In the example shown in the figure, the first extending section 61 includes a first portion 61b extending from the first fixed section 30 in the +Y-axis direction (extending along the Y axis) and a second portion 61c extending from the first portion 61b in the +X-axis direction (extending in the direction of the X axis). The second portion 61c includes the first opposed section 61a at an end.

The second extending section 62 extends from the first fixed section 30. The second extending section 62 includes a second opposed section 62a. The second opposed section 62a is located in the −X-axis direction of the fifth movable electrode finger 55 and opposed to a side surface of the fifth movable electrode finger 55. The second opposed section 62a may be provided line-symmetrically to the first opposed section 61a with respect to the X axis. In the example shown in the figure, the second extending section 62 includes a third portion 62b extending from the first fixed section 30 in the −Y-axis direction and a fourth portion 62c extending from the third portion 62b in the +X-axis direction. The fourth portion 62c includes the second opposed section 62a at an end.

The third extending section 63 extends from the second fixed section 32. The third extending section 63 includes a third opposed section 63a. The third opposed section 63a is located in the +X-axis direction of the third movable electrode finger 53 and opposed to a side surface of the third movable electrode finger 53. The third opposed section 63a may be provided point-symmetrically to the first opposed section 61a with respect to the center O. In the example shown in the figure, the third extending section 63 includes a fifth portion 63b extending from the second fixed section 32 in the −Y-axis direction and a sixth portion 63c extending from the fifth portion 63b in the −X-axis direction. The sixth portion 63c includes the third opposed section 63a at an end.

The fourth extending section 64 extends from the second fixed section 32. The fourth extending section 64 includes a fourth opposed section 64a. The fourth opposed section 64a is located in the +X-axis direction of the sixth movable electrode finger 56 and opposed to a side surface of the sixth movable electrode finger 56. The fourth opposed section 64a may be provided line-symmetrically to the third opposed section 63a with respect to the X axis. In the example shown in the figure, the fourth extending section 64 includes a seventh portion 64b extending from the second fixed section 32 in the +Y-axis direction and an eighth portion 64c extending from the seventh portion 64b in the −X-axis direction. The eighth portion 64c includes the fourth opposed section 64a at an end.

The first extending section 61 and the first movable electrode finger 51 are provided to surround the beam 41 of the coupling section 40 in plan view. Similarly, the third extending section 63 and the third movable electrode finger 53 are provided to surround the beam 46 of the coupling section 44. The second extending section 62 and the fifth movable electrode finger 55 are provided to surround the beam 42 of the coupling section 40. The fourth extending section 64 and the sixth movable electrode finger 56 are provided to surround the beam 45 of the second coupling section 44.

The first extending section 61 is provided between the beam 41 of the coupling section 40 and the second wire 82 in plan view. Similarly, the third extending section 63 is provided between the beam 46 of the coupling section 44 and the second wire 82. The fourth extending section 64 is provided between the beam 45 of the coupling section 44 and the second wire 82.

A protrusion section 65 is provided in at least one of the first opposed section 61a of the first extending section 61 and a portion of (the movable electrode section 8 of) the first movable electrode finger 51 opposed to the first opposed section 61a. In the example shown in the figure, the first opposed section 61a includes two protrusion sections 65. A plane shape of the protrusion sections 65 is, for example, a semicircle. In the example shown in the figure, the protrusion sections 65 are provided extending across the outer edge 15 of the recess 14 in plan view. The protrusion sections 65 of the first extending section 61 are portions projecting from a rectangular portion of the second portion 61c to the first movable electrode finger 51 side in plan view. Similarly, each of the opposed sections 62a, 63a, and 64a includes the two protrusion sections 65.

A distance L1 between the protrusion sections 65 of the first opposed section 61a and the first movable electrode finger 51 (the movable electrode section 8 opposed to the first opposed section 61a) is smaller than a distance L2 between the first fixed electrode section 71 and the second movable electrode finger 52 (the other movable electrode section 8). Similarly, a distance L3 between the protrusion sections 65 of the third opposed section 63a and the third movable electrode finger 53 is smaller than a distance L4 between the second fixed electrode section 72 and the fourth movable electrode finger 54. A distance L5 between the protrusion sections 65 of the second opposed section 62a and the fifth movable electrode finger 55 is smaller than a distance L6 between the third fixed electrode section 73 and the fourth movable electrode finger 54. A distance L7 between the protrusion sections 65 of the fourth opposed section 64a and the sixth movable electrode finger 56 is smaller than a distance L8 between the fourth fixed electrode section 74 and the second electrode finger 52.

The distance L1 between the protrusion sections 65 of the first opposed section 61a and the first movable electrode finger 51 is also smaller than the distance between the sixth movable electrode finger 56 and the first fixed electrode section 71. Similarly, the distance L3 is smaller than the distance between the fifth movable electrode finger 55 and the second fixed electrode section 72. The distance L5 is smaller than the distance between the third movable electrode finger 53 and the third fixed electrode section 73. The distance L7 is smaller than the distance between the first movable electrode finger 51 and the fourth fixed electrode section 74.

The fixed electrode sections 71 to 74 are joined and fixed to the substrate 10. Specifically, one ends of the fixed electrode sections 71 to 74 are joined to the upper surface 12 of the substrate 10 as fixed ends. The other ends of the fixed electrode sections 71 to 74 extend to the movable body 20 side as free ends. In the example shown in the figure, a plane shape of the fixed electrode sections 71 to 74 is a rectangle having a long side extending along the Y axis. The material of the fixed electrode sections 71 to 74 is silicon imparted with electrical conductivity by being doped with impurities such as phosphorous or boron.

The fixed electrode sections 71 to 74 are arranged to be opposed to the movable electrode section 8. Specifically, the first fixed electrode section 71 is located in the −X-axis direction of the second movable electrode finger 52 and provided to be opposed to the second movable electrode finger 52. Further, the first fixed electrode section 71 is located in the −X-axis direction of the sixth movable electrode finger 56 and provided to be opposed to the sixth movable electrode finger 56. A plurality of the first fixed electrode sections 71 are provided to correspond to the movable electrode fingers 52 and 56. The plurality of first fixed electrode sections 71 are electrically connected to one another via the contact section 80 and the first wire 81.

The second fixed electrode section 72 is located in the +X-axis direction of the fourth movable electrode finger 54 and provided to be opposed to the fourth movable electrode finger 54. Further, the second fixed electrode section 72 is located in the +X-axis direction of the fifth movable electrode finger 55 and provided to be opposed to the fifth movable electrode finger 55. A plurality of the second fixed electrode sections 72 are provided to correspond to the movable electrode fingers 54 and 55. The plurality of second fixed electrode sections 72 are electrically connected to one another via the contact section 80 and the first wire 81. The second fixed electrode section 72 may be provided point-symmetrically to the first fixed electrode section 71 with respect to the center C.

The third fixed electrode section 73 is located in the −X-axis direction of the fourth movable electrode finger 54 and provided to be opposed to the fourth movable electrode finger 54. Further, the third fixed electrode section 73 is located in the −X-axis direction of the third movable electrode finger 53 and provided to be opposed to the third movable electrode finger 53. A plurality of the third fixed electrode sections 73 are provided to correspond to the movable electrode fingers 53 and 54. The plurality of third fixed electrode sections 73 are electrically connected to one another via the contact section 80 and the second wire 82. The third fixed electrode section 73 may be provided line-symmetrically to the first fixed electrode section 71 with respect to the X axis.

The fourth fixed electrode section 74 is located in the +X-axis direction of the second movable electrode finger 52 and provided to be opposed to the second movable electrode finger 52. Further, the fourth fixed electrode section 74 is located in the +X-axis direction of the first movable electrode finger 51 and provided to be opposed to the first movable electrode finger 51. A plurality of the forth fixed electrode sections 74 are provided to correspond to the movable electrode fingers 51 and 52. The plurality of fourth fixed electrode sections 74 are electrically connected to one another via the contact section 80 and the second wire 82. The fourth fixed electrode section 74 may be provided line-symmetrically to the second fixed electrode section 72 with respect to the X axis.

The first wire 81 is provided on the substrate 10. Specifically, the first wire 81 is provided in the first groove section 16 formed on the upper surface 12 of the substrate 10. In the example shown in the figure, the first wire 81 is provided to surround the recess 14 in plan view. The first wire 81 is connected to the fixed electrode sections 71 and 72 via the contact section 80. That is, the fixed electrode sections 71 and 72 are electrically connected to each other.

The second wire 82 is provided on the substrate 10. Specifically, the second wire 82 is provided in the second groove section 17 formed on the upper surface 12 of the substrate 10. In the example shown in the figure, the second wire 82 is provided to surround the recess 14 in plan view. The second wire 82 is connected to the fixed electrode sections 73 and 74 via the contact section 80. That is, the fixed electrode sections 73 and 74 are electrically connected to each other.

The third wire 83 is provided on the substrate 10. Specifically, the third wire 83 is provided in the third groove section 18 formed on the upper surface 12 of the substrate 10. The third wire 83 is connected to the first fixed section 30 via the contact section 80.

The pads 84, 85, and 86 are provided on the substrate 10. Specifically, the pads 84, 85, and 86 are respectively provided in the groove sections 16, 17, and 18 and connected to the wires 81, 82, and 83. The pads 84, 85, and 86 are provided in positions not overlapping the lid body 90 in plan view. In the example shown in the figure, the pads 84, 85, and 86 are arranged in the Y-axis direction.

The material of the wires 81, 82, and 83, the pads 84, 85, and 86, and the contact section 80 (hereinafter also referred to as "wire 81 and the like") is, for example, ITO (Indium Tin Oxide), aluminum, gold, platinum, titanium, tungsten, or chrome. If the material of the wire 81 and the like is a transparent electrode material such as ITO, when the substrate 10 is transparent, it is possible to easily visually recognize, from the lower surface (a surface on the opposite side of the upper surface 12) side of the substrate 10, foreign matters present on the wire 81 and the like.

Although not shown in the figure, the material of the wires 81, 82, and 83 may be silicon imparted with electrical conductivity by being doped with impurities such as phosphorus or boron. In this case, the wires 81, 82, and 83 may be jointed to the upper surface 12 of the substrate 10.

As shown in FIG. 2, the lid body 90 is provided on the substrate 10. The substrate 10 and the lid body 90 form a package. The substrate 10 and the lid body 90 form a cavity 92. In the cavity 92, the movable body 20, the fixed sections 30 and 32, the coupling sections 40 and 44, the movable electrode section 8, the extending sections 61 to 64, and the fixed electrode sections 71 to 74 (hereinafter also referred to as "movable body 20 and the like") are housed. An air gap 2 (an air gap in the third groove section 18) between the third wire 83 and the lid body 90 shown in FIG. 2 may be buried by a bonding member (not shown in the figure). In this case, the cavity 92 may be closed by an inert gas (e.g., nitrogen gas) atmosphere. The material of the lid body 90 is, for example, silicon or glass.

The functional device 100 can measure, by using the pads 84 and 86, capacitance between the second movable electrode finger 52 and the first fixed electrode section 71, capacitance between the fourth movable electrode finger 54 and the second fixed electrode section 72, capacitance between the fifth movable electrode finger 55 and the second fixed electrode section 72, and capacitance between the sixth movable electrode finger 56 and the first fixed electrode section 71. Further, the functional device 100 can measure, by using the pads 85 and 86, capacitance between the first movable electrode finger 51 and the fourth fixed electrode section 74, capacitance between the second movable electrode finger 52 and the fourth fixed electrode section 74, capacitance between the third movable electrode finger 53 and the third fixed electrode section 73, and capacitance between the fourth movable electrode finger 54 and the third fixed electrode section 73.

As explained above, the functional device 100 can separately measure the capacitances between the movable electrode fingers 52, 54, 55, and 56 and the fixed electrode sections 71 and 72 and the capacitances between the movable electrode fingers 51, 52, 53, and 54 and the fixed electrode sections 73 and 74 and detect acceleration on the basis of a result of the measurement (using a so-called differential detection system).

In the above explanation, the functional device 100 is the acceleration sensor (the physical quantity sensor) that detects acceleration in the X-axis direction. However, the functional device according to the invention may be an acceleration sensor that detects acceleration in the Y-axis direction or may be an acceleration sensor that detects acceleration in the vertical direction (the Z-axis direction. The functional device according to the invention is not limited to the acceleration sensor and may be, for example, a gyro sensor that detects an angular velocity. The functional device 100 may be a device other than the physical quantity sensor such as a MEMS (Micro Electro Mechanical Systems) oscillator as long as movable electrode sections and fixed electrode sections are provided in the device in a comb teeth shape.

In the example explained above, the first opposed section 61a includes the protrusion sections 65. However, a portion of the first movable electrode finger 51 opposed to the first opposed section 61a may include the protrusion sections 65. Similarly, portions of the movable electrode fingers 53, 55, and 56 opposed to the opposed sections 63a, 62a and 64a may include the protrusion sections 65.

The functional device 100 has, for example, characteristics explained below.

The functional device 100 includes the movable body 20 displaceable along the X axis, the fixed section 3 configured to support the movable body 20 in the coupling section 40, the movable electrode section 8 (the movable electrode fingers 51 and 52) extending from the movable body 20, the fixed electrode section 71 arranged to be opposed to the movable electrode section 8 (the second movable electrode finger 52), and the extending section 61 extending from the fixed section 3 and including the opposed section 61a opposed to the side surface of the movable electrode section 8 (the first movable electrode finger 51). The distance L1 between the opposed section 61a and the movable electrode section 8 (the first movable electrode finger 51) is smaller than the distance L2 between the fixed electrode section 71 and the movable electrode section 8 (the second movable electrode finger 52). That is, a plurality of the movable electrode sections 8 are provided along the X axis. The distance L1 between the opposed section 61a and the movable electrode section 8 (the first movable electrode finger 51) opposed to the opposed section 61a is smaller than the distance L2 between the fixed electrode section 71 and the other movable electrode section 8 (the second movable electrode finger 52). Therefore, when a force in the −X-axis direction acts on the movable body 20 because of excessive acceleration, the first movable electrode finger 51 collides with the first opposed section 61a before the second movable electrode finger 52 collides with the first fixed electrode section 71. Therefore, in the functional device 100, it is possible to suppress the second movable electrode finger 52 and the first fixed electrode section 71 from being damaged.

Further, in the functional device 100, since the extending section 61 extends from the fixed section 30, the opposed section 61a can have potential equal to the potential of the movable electrode section 8. Therefore, when the first movable electrode finger 51 collides with the opposed section 61a, it is possible to suppress the first movable electrode finger 51 from adhering to the first opposed section 61a.

Further, in the functional device 100, for example, after a silicon substrate is etched and the movable body 20, the first movable electrode finger 51, and the extending section 61 are formed, it is possible to suppress the first movable electrode finger 51 from adhering to the opposed section 61a. When the opposed section does not have potential equal to the potential of the movable electrode section, since an electrostatic force is proportional to a square of an inverse of a gap G between the opposed section and the movable electrode section $(1/G)^2$, the movable electrode section sometimes adheres to the first opposed section.

Consequently, the functional device 100 can accurately detect a physical quantity (acceleration) and secure reliability.

In the functional device 100, the protrusion sections 65 are provided in at least one of the first opposed section 61a of the extending section 61 and a portion of the movable electrode section 8 (the first movable electrode finger 51) opposed to the first opposed section 61a. Therefore, in the functional device 100, when a force in the −X-axis direction acts on the movable body 20 because of excess acceleration, the first movable electrode finger 51 can collide with the protrusion sections 65. Therefore, in the functional device 100, compared with a form not including the protrusion sections 65, it is possible to reduce a contact area between the first movable electrode finger 51 and the first opposed section 61a. Consequently, it is possible to more surely suppress the first movable electrode finger 51 from adhering to the first opposed section 61a.

Similarly, the protrusion sections 65 are provided in each of the opposed sections 62a, 63a, and 64a. Therefore, it is possible to more surely suppress the movable electrode fingers 53, 55, and 56 from respectively adhering to the opposed sections 63a, 62a, and 64a.

In the functional device 100, the fixed section 3, the extending sections 61, 62, 63, and 64, the coupling sections 40 and 44, the movable electrode section 8, and the movable body 20 are integrally provided. Consequently, in the functional device 100, for example, by machining one silicon substrate, it is possible to integrally form the fixed section 3, the extending sections 61, 62, 63, and 64, the coupling sections 40 and 44, the movable electrode section 8, and the movable body 20.

In the functional device 100, the first extending section 61 and the first movable electrode finger 51 are provided to surround the beam 41 of the coupling section 40. Therefore, for example, it is possible to suppress unnecessary electrostatic force from acting on the coupling section 40 because of the wires 81 and 82. The coupling sections 40 and 44 are portions that greatly contribute to sensitivity of the functional device 100. When unnecessary electrostatic force acts on the coupling sections, sensitivity of the functional device sometimes falls.

Similarly, the extending sections 63, 62, and 64 and the movable electrode fingers 53, 55, and 56 are provided to respectively surround the beams 46, 42, and 45. Therefore, it is possible to suppress unnecessary electrostatic force from acting on the coupling sections 40 and 44.

In the functional device 100, the distance L3 between the third opposed section 63a and the third movable electrode finger 53 is smaller than the distance L4 between the second fixed electrode section 72 and the fourth movable electrode finger 54. Therefore, in the functional device 100, when a force in the +X-axis direction acts on the movable body 20 because of excessive acceleration, the third movable electrode finger 53 collides with the third opposed section 63a before the fourth movable electrode finger 54 collides with the second fixed electrode section 72. Therefore, in the functional device 100, it is possible to suppress the fourth movable electrode finger 54 and the second fixed electrode section 72 from being damaged.

Further, in the functional device 100, the third extending section 63 can suppress the third movable electrode finger 53 from adhering to the third opposed section 63a in the same manner as the first movable electrode finger 51 adhering to the first opposed section 61a.

Further, the functional device 100 can suppress, with the opposed sections 61a and 63a, the movable body 20 from rotating (specifically, rotating counterclockwise about the Z axis that passes the center O). For example, in a form in which the fixed section includes the protrusion section and the movable body collides with the protrusion section of the fixed section before the movable electrode section collides with the fixed electrode section, it is possible to suppress the rotation of the movable body with the protrusion section. That is, in the functional device 100, the opposed sections 61a and 63a are opposed to the movable electrode fingers 51 and 53 extending from the movable body 20 in the opposite directions each other. The distance in the Y-axis direction between the opposed sections 61a and 63a can be increased. Therefore, in the functional device 100, compared with the form explained above (the form in which the movable body collides with the protrusion section of the fixed section), it is possible to suppress the rotation of the movable body 20. As a result, in the functional device 100, it is possible to more surely detect acceleration.

In the functional device 100, the distance L5 between the second opposed section 62a and the fifth movable electrode finger 55 is smaller than the distance L6 between the third fixed electrode section 73 and the fourth movable electrode finger 54. Further, the distance L7 between the fourth opposed section 64a and the sixth movable electrode finger 56 is smaller than the distance L8 between the fourth fixed electrode section 74 and the second movable electrode finger 52. Therefore, in the functional device 100, as explained above, it is possible to suppress the movable body 20 from rotating (specifically, rotating clockwise about the Z axis that passes the center O).

In the functional device 100, the movable electrode section 8 includes the first movable electrode section 6 extending from one end of the movable body 20 along the Y axis that crosses the X axis and the second movable electrode section 7 extending from the other end on the opposite side of the one end. The functional device 100 further includes the first extending section 61 extending from the first fixed section 30 and including the first opposed section 61a opposed to the side surface of the first movable electrode section 6 (the first movable electrode finger 51) and the second extending section 62 extending from the first fixed section 30 and including the second opposed section 62a opposed to the side surface of the second movable electrode section 7 (the fifth movable electrode finger 55). Therefore, in the functional device 100, it is possible to suppress the movable body 20 from rotating.

In the functional device 100, the fixed section 3 includes the first fixed section 30 and the second fixed section 32. The movable body 20 is supported by the first fixed section 30 and the second fixed section 32 in the coupling sections 40 and 44. The movable electrode section 8 includes the first movable electrode section 6 extending from one end of the movable body 20 along the Y axis that crosses the X axis and the second movable electrode section 7 extending from the other end on the opposite side of the one end along the Y axis. The functional device 100 further includes the first extending section 61 extending from the first fixed section 30 and including the first opposed section 61a opposed to the side surface of the first movable electrode section 6 (the first movable electrode finger 51) and the third extending section 63 extending from the second fixed section 32 in the opposite direction of the first extending section 61 and including the third opposed section 63a opposed to the side surface of the second movable electrode section 7 (the third movable electrode finger 53). Therefore, in the functional device 100, it is possible to suppress the movable body 20 from rotating.

1.2 Manufacturing Method for the Functional Device

Figure 3:
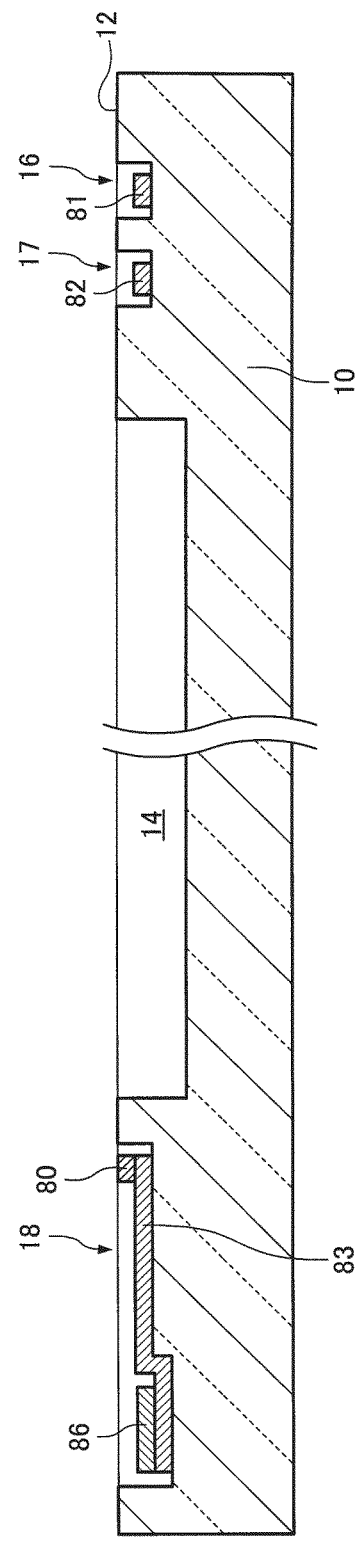
FIG. 3 is a sectional view schematically showing a manufacturing process for the physical quantity sensor according to the first embodiment.
Figure 4:
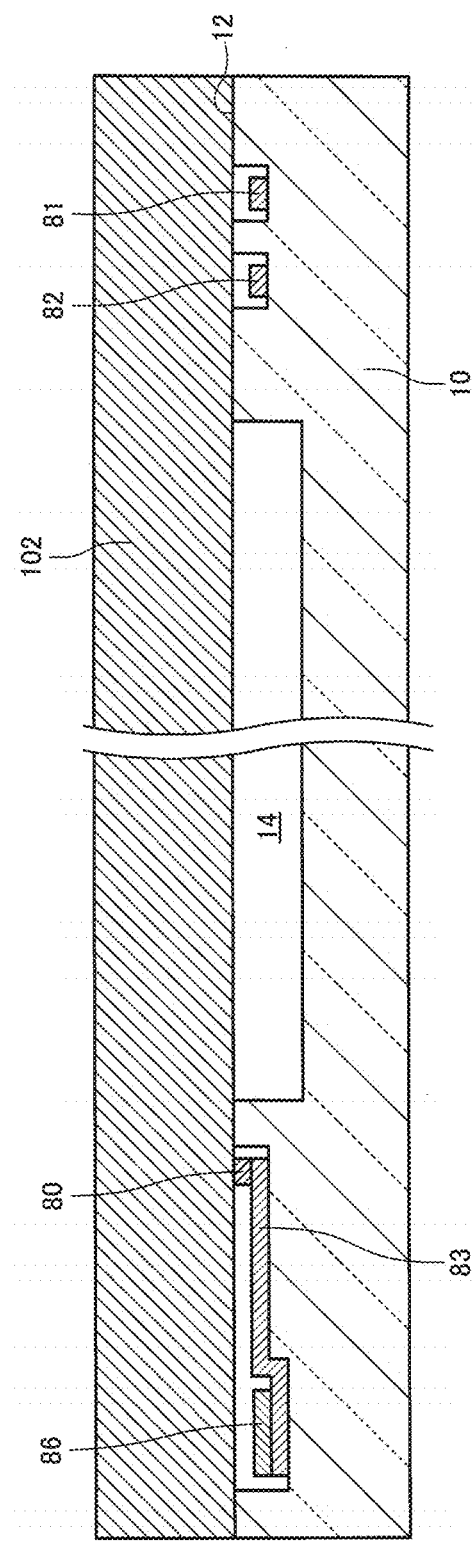
FIG. 4 is a sectional view schematically showing the manufacturing process for the physical quantity sensor according to the first embodiment.
Figure 5:
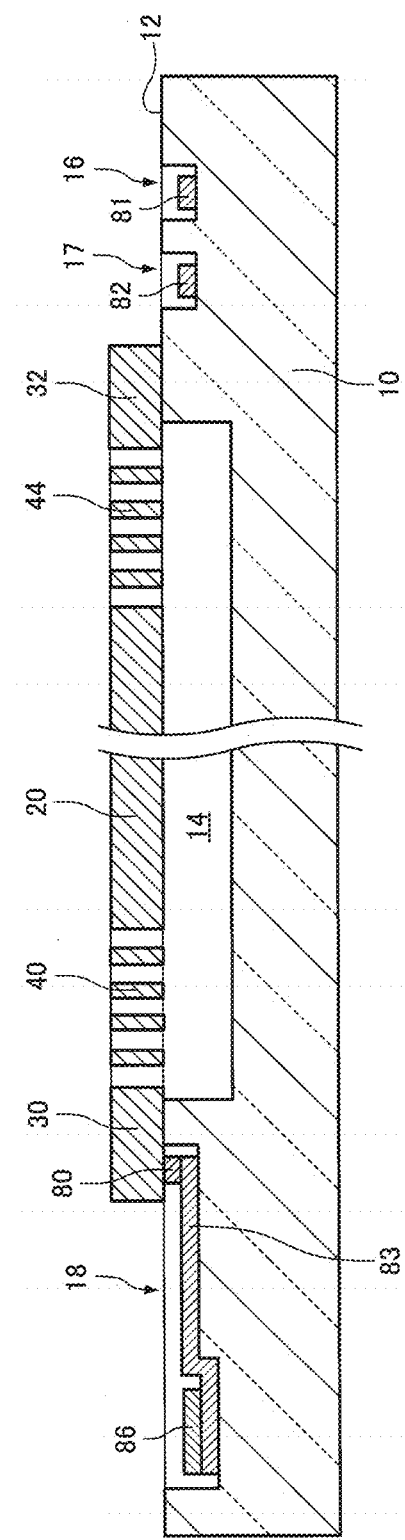
FIG. 5 is a sectional view schematically showing the manufacturing process for the physical quantity sensor according to the first embodiment.

A manufacturing method for the functional device according to the first embodiment is explained with reference to the drawings. FIGS. 3 to 5 are sectional views schematically showing a manufacturing process for the functional device 100 according to the first embodiment and correspond to FIG. 2.

As shown in FIG. 3, for example, a glass substrate is patterned (specifically, patterned through photolithography and etching) to form the recess 14 and the groove sections 16, 17, and 18. According to this process, it is possible to obtain the substrate 10 on which the recess 14 and the groove sections 16, 17, and 18 are formed.

Subsequently, the wires 81, 82, and 83 are respectively formed in the groove sections 16, 17, and 18. The contact section 80 is formed on the wires 81, 82, and 83. The pads 84, 85, and 86 are respectively formed to be connected to the wires 81, 82, and 83. The contact section 80, the wires 81, 82, and 83, and the pads 84, 85, and 86 are formed by film formation by a sputtering method or a CVD (Chemical Vapor Deposition) method and patterning. The order of a process for forming the contact section 80 and a process for forming the pads 84, 85, and 86 may be any order.

The contact section 80 is preferably formed to project further upward than the upper surface 12 of the substrate 10. Consequently, it is possible to surely bring the contact section 80 into contact with a silicon substrate 102 explained below.

As shown in FIG. 4, for example, the silicon substrate 102 is joined to the substrate 10. The joining of the substrate 10 and the silicon substrate 102 is performed by, for example, anodic bonding. Consequently, it is possible to firmly join the substrate 10 and the silicon substrate 102.

As shown in FIG. 5, the silicon substrate 102 is ground by, for example, a grinding machine to be thinned and thereafter patterned into a predetermined shape to integrally form the movable body 20, the fixed sections 30 and 32, the coupling sections 40 and 44, the movable electrode section 8, and the extending sections 61 to 64. Further, in this process, the fixed electrode sections 71 to 74 are formed. The etching of the patterning in this process may be performed by a Bosch method.

As shown in FIG. 2, the lid body 90 is joined to the substrate 10. The movable body 20 and the like are housed in the cavity 92 formed by the substrate 10 and the lid body 90. The joining of the substrate 10 and the lid body 90 is performed by, for example, anodic bonding. Consequently, it is possible to firmly join the substrate 10 and the lid body 90. By performing this process in an inert gas atmosphere, it is possible to fill an inert gas in the cavity 92.

The functional device 100 can be manufactured by the process explained above.

1.3. Modifications of the Functional Device 1.3.1. First Modification

Figure 6:
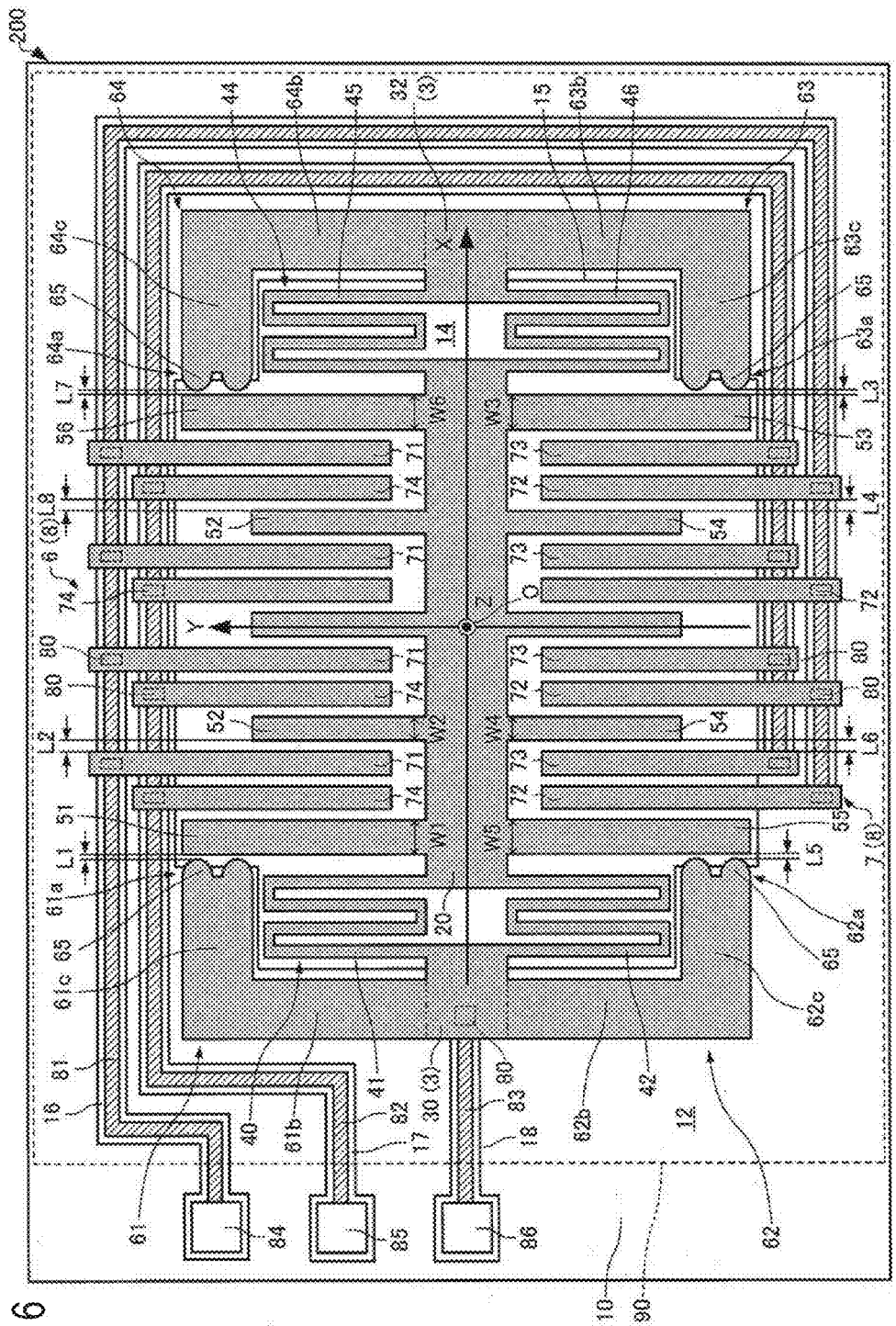
FIG. 6 is a plan view schematically showing a physical quantity sensor according to a first modification of the first embodiment.

A functional device according to a first modification of the first embodiment is explained with reference to the drawings. FIG. 6 is a plan view schematically showing a functional device 200 according to the first modification of the first embodiment.

For convenience, in FIG. 6, the lid body 90 is seen through. In FIG. 6, as three axes orthogonal to one another, the X axis, the Y axis, and the Z axis are shown.

In the following explanation, in the functional device 200 according to the first modification of the first embodiment, members having functions same as the functions of the members of the functional device 100 according to the first embodiment are denoted by the same reference numerals and signs and detailed explanation of the members is omitted. The same applies to a functional device 300 according to a second modification of the first embodiment explained below.

In the functional device 100, as shown in FIG. 1, the widths (the sizes in the X-axis direction) of the movable electrode fingers 51 to 56 are equal to each other. On the other hand, in the functional device 200, as shown in FIG. 6, widths W1, W3, W5, and W6 of the movable electrode fingers 51, 53, 55, and 56 are larger than the widths W2 and W4 of the movable electrode fingers 52 and 54.

In the functional device 200, since the widths W1, W3, W5, and W6 are larger than the widths W2 and W4, the movable electrode fingers 51, 53, 55, and 56 can have high rigidity compared with the movable electrode fingers 52 and 54. Therefore, in the functional device 100, when the movable electrode fingers 51, 53, 55, and 56 respectively collide with the opposed sections 61a, 63a, 62a, and 64a, it is possible to suppress the movable electrode fingers 51, 53, 55, and 56 from being damaged.

1.3.2. Second Modification

Figure 7:
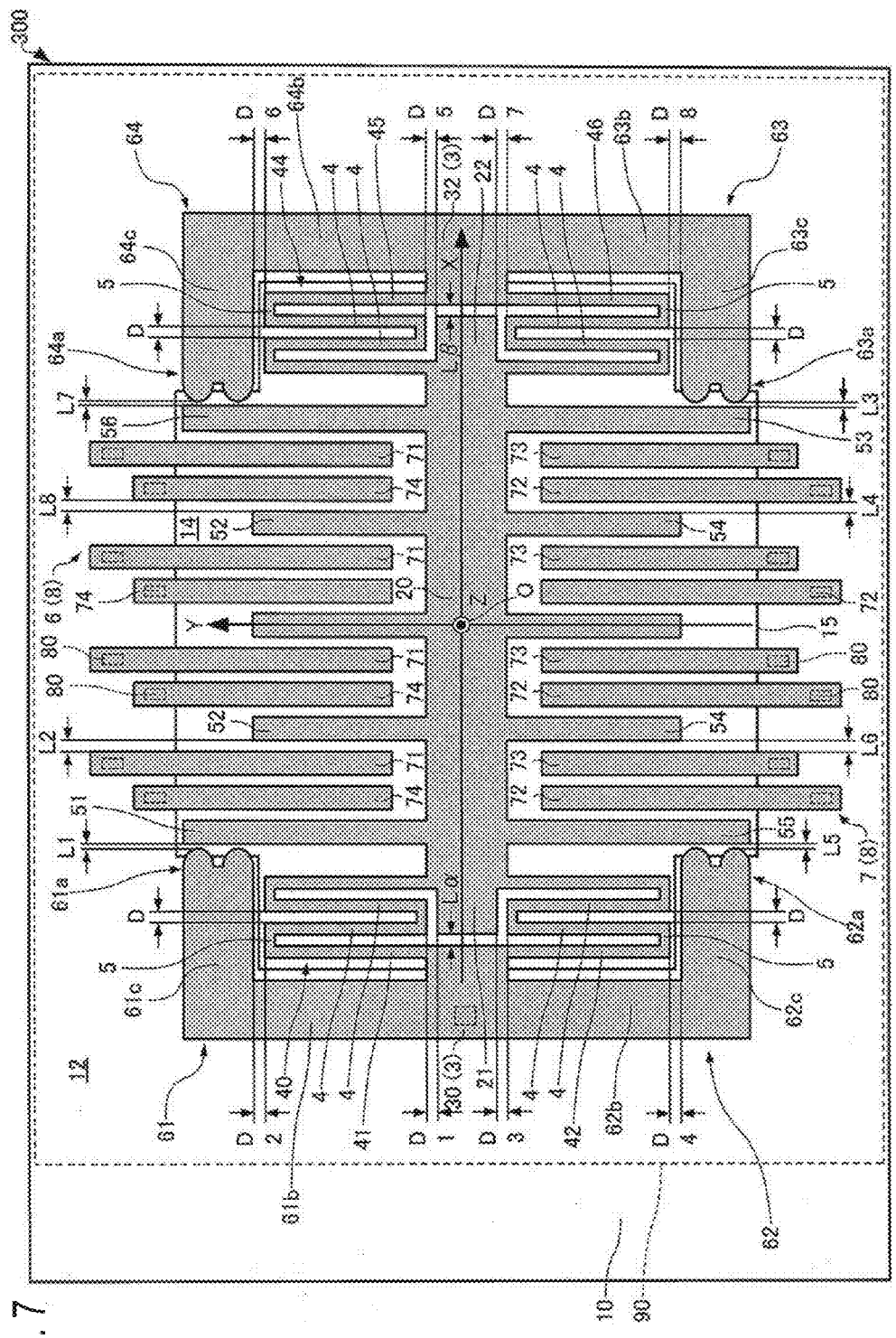
FIG. 7 is a plan view schematically showing a physical quantity sensor according to a second modification of the first embodiment.

A functional device according to a second modification of the first embodiment is explained with reference to the drawings. FIG. 7 is a plan view schematically showing a functional device 300 according to the second modification of the first embodiment.

For convenience, in FIG. 7, the groove sections 16, 17, and 18, the wires 81, 82, and 83, and the pads 84, 85, and 86 not shown. In FIG. 7, the lid body 90 is seen through. In FIG. 7, as three axes orthogonal to one another, the X axis, the Y axis, and the Z axis are shown. The same applies to FIGS. 8 and 9 explained below.

In the functional device 100, as shown in FIG. 1, a plane shape of the movable body 20 is a rectangle. On the other hand, in the functional device 300, as shown in FIG. 7, the movable body 20 includes first and second projections 21 and 22.

The first projection 21 of the movable body 20 is located between the beams 41 and 42 of the coupling section 40. That is, the movable body 20 is provided to extend between the beam 41 and the beam 42. In an example shown in the figure, a plane shape of the first projection 21 is a rectangle. The first projection 21 extends from a portion having a rectangular shape of the movable body 20 (a portion to which the movable electrode fingers 51 to 56 are connected) in the −X-axis direction in plan view.

The beam 41 of the coupling section 40 is formed by first beam sections 4 extending in the Y-axis direction and second beam sections 5 extending in the X-axis direction. In the example shown in the figure, a plane shape of the first beam sections 4 is a rectangle having a long side extending along the Y axis. A plane shape of the second beam sections 5 is a rectangle having a long side extending along the X axis. A distance between the first beam sections 4 adjacent to each other is D. Similarly, the beams 42, 45, and 46 are formed by the first beam sections 4 and the second beam sections 5.

A distance D1 between the first projection 21 of the movable body 20 and the beam 41 is preferably equal to the distance D between the adjacent first beam sections 4. Further, the distance D1 is preferably equal to a distance D2 between the second portion 61c of the first extending section 61 and the beam 41. Similarly, a distance D3 between the first projection 21 and the beam 42 is preferably equal to the distance D. Further, the distance D3 is preferably equal to a distance D4 between the sixth portion 63c of the third extending section 63 and the beam 42.

A distance Lα between the first projection (an extending portion) 21 of the movable body 20 and an end of the first fixed section 30 is smaller than a distance L2 between the first fixed electrode section 71 and the second movable electrode finger 52. Further, the distance Lα is smaller than a distance L6 between the third fixed electrode section 73 and the fourth movable electrode finger 54.

The second projection 22 of the movable body 20 is located between the two beams 45 and 46 of the coupling section 44. In the example shown in the figure, a plane shape of the second projection 22 is a rectangle. The second projection 22 extends from the portion having the rectangular shape of the movable body 20 (the portion to which the movable electrode fingers 51 to 56 are connected) in the +X-axis direction in plan view.

A distance D5 between the second projection 22 of the movable body 20 and the beam 45 is preferably equal to the distance D between the adjacent first beam sections 4. Further, the distance D5 is preferable equal to a distance D6 between the eighth portion 64c of the fourth extending section 64 and the beam 45. Similarly, a distance D7 between the second projection 22 and the beam 46 is preferably equal to the distance D. Further, the distance D7 is preferably equal to a distance D8 between the fourth portion 62c of the second extending section 62 and the beam 46.

A distance Lβ between the second projection (an extending portion) 22 of the movable body 20 and an end of the second fixed section 32 is smaller than the distance L4 between the second fixed electrode section 72 and the fourth movable electrode finger 54. Further, the distance Lβ is smaller than the distance L8 between the fourth fixed electrode section 74 and the second movable electrode finger 52.

The distance Lα between the first projection 21 and the first fixed section 30 and the distance Lβ between the second projection 22 and the second fixed section 32 may be smaller than, for example, the distances L1 to L8.

In the functional device 300, the movable body 20 includes the projections 21 and 22. Therefore, compared with the functional device 100, it is possible to increase the mass of the movable body 20. As a result, when acceleration is applied, it is possible to increase a force acting on the movable body 20. In this way, in the functional device 300, it is possible to increase the mass of the movable body 20 making use of a space between the beams 41 and 42 and a space between the beams 45 and 46. For example, in a form in which the fixed section includes the protrusion section and the movable body collides with the protrusion section of the fixed section before the movable electrode section collides with the fixed electrode section, in some case, the mass of the movable body cannot be increased making use of the space between the two beams of the coupling section because the protrusion section of the fixed section is an obstacle.

In the functional device 300, the distances D1, D3, D5, and D7 are equal to the distances D, D2, D4, and D6. Therefore, when the silicon substrate 102 (see FIG. 4) is dry-etched to form the coupling sections 40 and 44, it is possible to equalize etching speed. As a result, it is possible to highly accurately form the coupling sections 40 and 44 and increase sensitivity of a desired characteristic (a designed characteristic) of the functional device 300. For example, in a form in which the distances D1, D3, D5, and D7 are different from the distances D, D2, D4, and D6, in some case, etching speed for forming the coupling section fluctuates because of a micro loading effect.

In the functional device 300, the distances Lα and Lβ are smaller than the distances L2, L4, L6, and L8. Therefore, the movable body 20 collides with the fixed sections 30 and 32 before the movable electrode fingers 52 and 54 collide with the fixed electrode sections 71 to 74. Therefore, in the functional device 300, it is possible to suppress the movable electrode fingers 52 and 54 and the fixed electrode sections 71 to 74 from being damaged.

2. Second Embodiment 2.1. Functional Device

Figure 8:
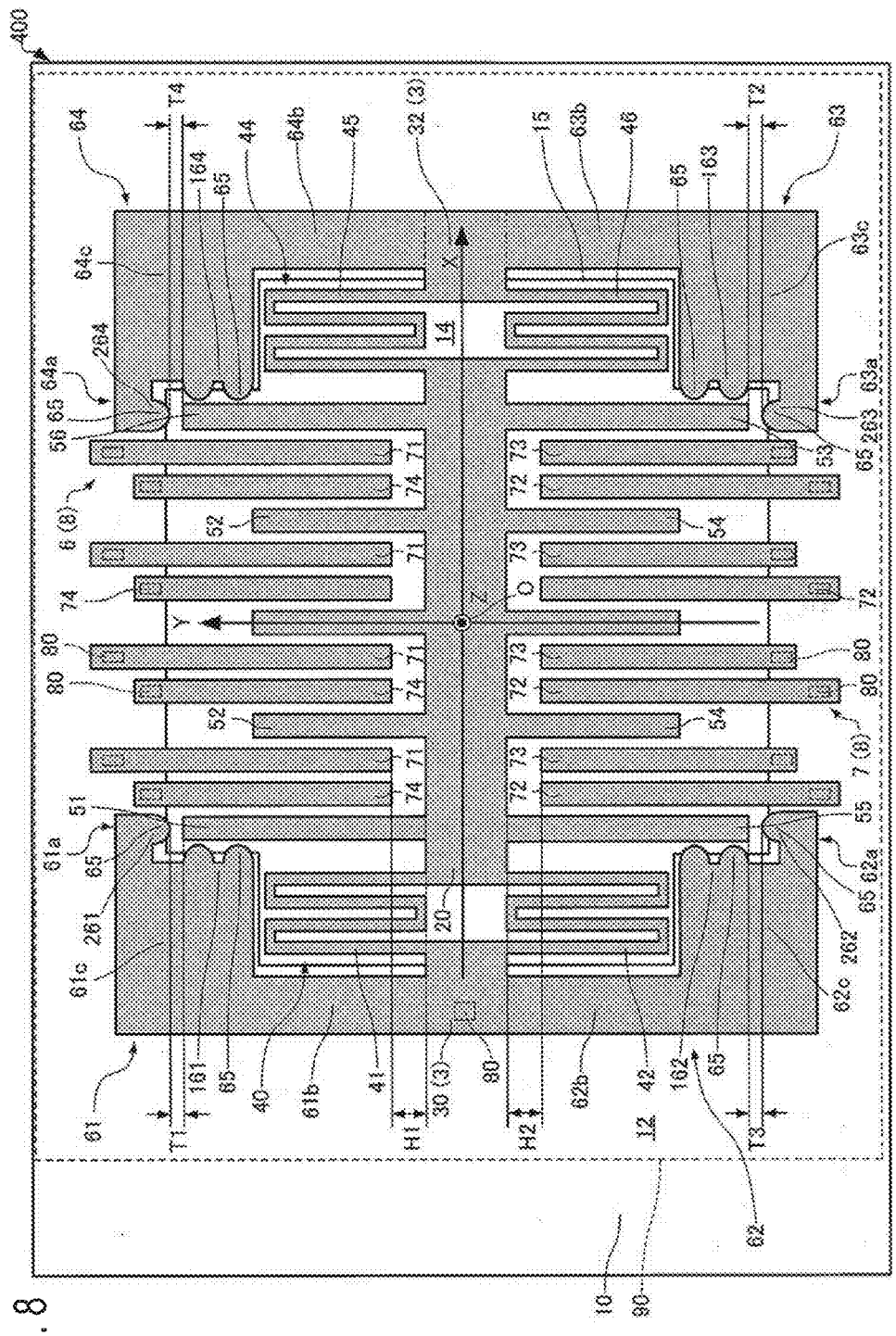
FIG. 8 is a plan view schematically showing a physical quantity sensor according to a second embodiment.

A functional device according to a second embodiment is explained with reference to the drawings. FIG. 8 is a plan view schematically showing a functional device 400 according to the second embodiment.

In the following explanation, in the functional device 400 according to the modification of the first embodiment, members having functions same as the functions of the members of the functional device 100 according to the first embodiment are denoted by the same reference numerals and signs and detailed explanation of the members is omitted.

In the functional device 400, as shown in FIG. 8, the first opposed section 61a is located in the +Y-axis direction of the first movable electrode finger 51 and opposed to the first movable electrode finger 51. That is, the first opposed section 61a includes a first portion 161 located in the −X-axis direction of the first movable electrode finger 51 and opposed to the first movable electrode finger 51 and a second portion 261 located in the +Y-axis direction of the first movable electrode finger 51 and opposed to the first movable electrode finger 51. That is, the first extending section 61 includes a portion opposed to a distal end face of the movable electrode section 8. In an example shown in the figure, the first portion 161 includes two protrusion sections 65. The second portion 261 includes one protrusion section 65. A distance T1 between the protrusion section 65 of the second portion 261 and the first movable electrode finger 51 is smaller than a distance H1 between the movable body 20 and the fixed electrode sections 71 and 74.

Similarly, the second opposed section 62a includes a third portion 162 located in the −X-axis direction of the fifth movable electrode finger 55 and opposed to the fifth movable electrode finger 55 and a fourth portion 262 located in the −Y-axis direction of the fifth movable electrode finger 55 and opposed to the fifth movable electrode finger 55. A distance T3 between the protrusion section 65 of the fourth portion 262 and the fifth movable electrode finger 55 is smaller than a distance H2 between the movable body 20 and the fixed electrode sections 72 and 73.

The third opposed section 63a includes a fifth portion 163 located in the +X-axis direction of the third movable electrode finger 53 and opposed to the third movable electrode finger 53 and a sixth portion 263 located in the −Y-axis direction of the third movable electrode finger 53 and opposed to the third movable electrode finger 53. A distance T2 between the protrusion section 65 of the sixth portion 263 and the third movable electrode finger 53 is smaller than the distance H2 between the movable body 20 and the fixed electrode sections 72 and 73.

The fourth opposed section 64a includes a seventh portion 164 located in the +X-axis direction of the sixth movable electrode finger 56 and opposed to the sixth movable electrode finger 56 and an eighth portion 264 located in the +Y-axis direction of the sixth movable electrode finger 56 and opposed to the sixth movable electrode finger 56. A distance T4 between the protrusion section 65 of the eighth portion 264 and the sixth movable electrode finger 56 is smaller than the distance H1 between the movable body 20 and the fixed electrode sections 71 and 74.

In the functional device 400, when a force in the +Y-axis direction acts on the movable body 20 because of excessive acceleration, before the movable body 20 collides with the fixed electrode sections 71 and 74, the first movable electrode finger 51 collides with the second portion 261 of the first opposed section 61a and the sixth movable electrode finger 56 collides with the eighth portion 264 of the fourth opposed section 64a. Therefore, in the functional device 400, it is possible to suppress the movable body 20 and the fixed electrode sections 71 and 74 from being damaged.

Further, in the functional device 400, when a force in the −Y-axis direction acts on the movable body 20 because of excessive acceleration, before the movable body 20 collides with the fixed electrode sections 72 and 73, the third movable electrode finger 53 collides with the sixth portion 263 of the third opposed section 63a and the fifth movable electrode finger 55 collides with the fourth portion 262 of the second opposed section 62a. Therefore, in the functional device 400, it is possible to suppress the movable body 20 and the fixed electrode sections 72 and 73 from being damaged.

2.2. Manufacturing Method for the Functional Device

A manufacturing method for the functional device according to the second embodiment is basically the same as the manufacturing method for the functional device according to the first embodiment. Therefore, explanation of the manufacturing method is omitted.

2.3 Modification of the Functional Device

Figure 9:
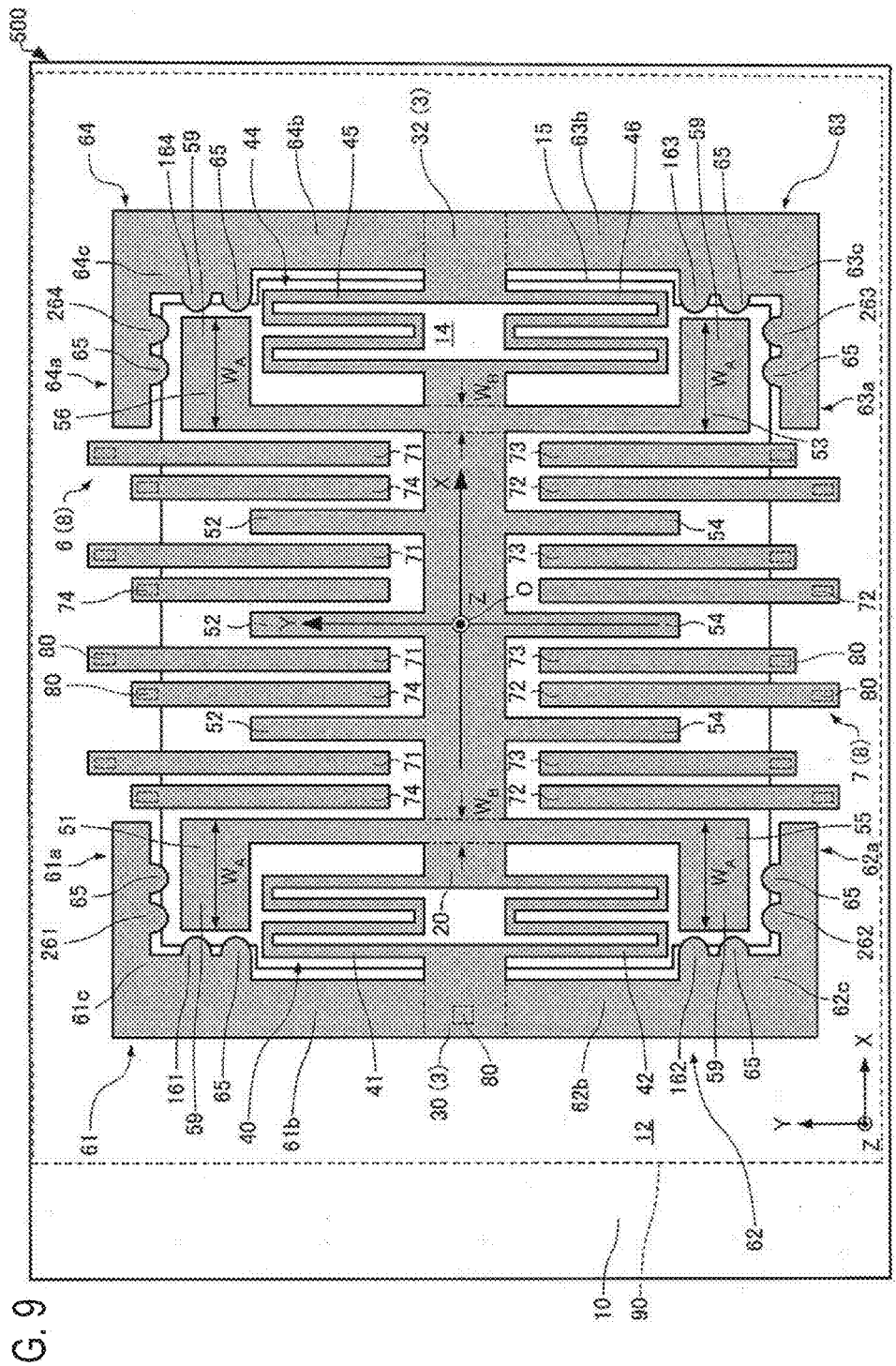
FIG. 9 is a plan view schematically showing a physical quantity sensor according to a modification of the second embodiment.

A functional device according to a modification of the second embodiment is explained with reference to the drawings. FIG. 9 is a plan view schematically showing a functional device 500 according to the modification of the second embodiment.

In the following explanation, in the functional device 500 according to the modification of the second embodiment, members having functions same as the functions of the members of the functional device 100 according to the first embodiment, the functional device 400 according to the second embodiment are denoted by the same reference numerals and signs and detailed explanation of the members is omitted.

In the functional device 400, as shown in FIG. 8, one protrusion section 65 is provided in each of the portions 261, 262, 263, and 264 of the opposed sections 61a, 62a, 63a, and 64a. On the other hand, in the functional device 500, as shown in FIG. 9, a plurality of the protrusion sections 65 are provided in each of the portions 261, 262, 263, and 264 of the opposed sections 61a, 62a, 63a, and 64a. In an example shown in the figure, each of the portions 261, 262, 263, and 264 has two protrusion sections 65.

In the functional device 500, width (size in the X-axis direction) $W_A$ of the distal end portion 59 of the first movable electrode finger 51 is larger than width $W_B$ of a base of the first movable electrode finger 51 (a boundary between the first movable electrode finger 51 and the movable body 20). Consequently, it is possible to increase an area of the first movable electrode finger 51 opposed to the second portion 261 of the first opposed section 61a and increase the number of the protrusion sections 65.

Similarly, in the functional device 500, the width $W_A$ of the distal end portions 59 of the movable electrode fingers 53, 55, and 56 is larger than the width $W_B$ of bases of the movable electrode fingers 53, 55, and 56 (boundaries between the movable electrode fingers 53, 55, and 56 and the movable body 20).

In the functional device 500, compared with the functional device 400, it is possible to increase the number of the protrusion sections 65 of the portions 261, 262, 263, and 264 of the opposed sections 61a, 62a, 63a, and 64a. Consequently, when the protrusion sections 65 of the portions 261, 262, 263, and 264 respectively collide with the movable electrode fingers 51, 55, 53, and 56, it is possible to reduce a shock applied to one protrusion section 65. As a result, it is possible to suppress the protrusion sections 65 and the movable electrode fingers 51, 53, 55, and 56 from being damaged.

3. Third Embodiment

An electronic apparatus according to a third embodiment is explained with reference to the drawings. The electronic apparatus according to the third embodiment includes the functional device according to the invention. An electronic apparatus including the functional device 100 as the functional device according to the invention is explained below.

Figure 10:
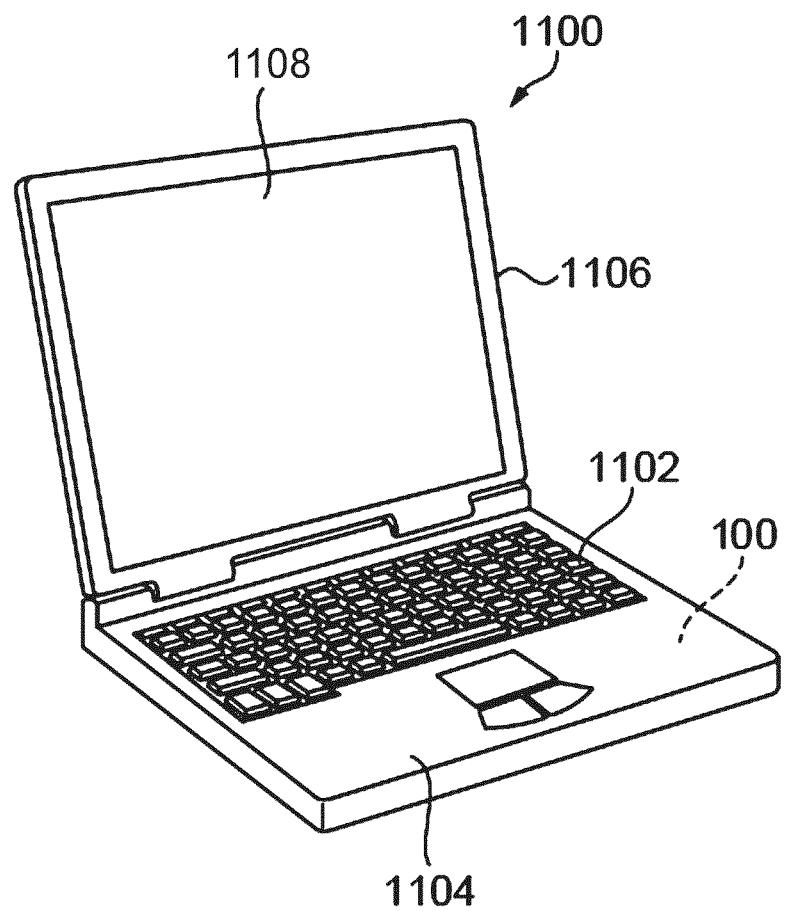
FIG. 10 is a perspective view schematically showing an electronic apparatus according to a third embodiment.

FIG. 10 is a perspective view schematically showing a mobile (or notebook) personal computer 1100 as the electronic apparatus according to the third embodiment.

As shown in FIG. 10, the personal computer 1100 includes a main body section 1104 including a keyboard 1102 and a display unit 1106 including a display section 1108. The display unit 1106 is pivotably supported on the main body section 1104 via a hinge structure section.

The functional device 100 is incorporated in the personal computer 1100.

Figure 11:
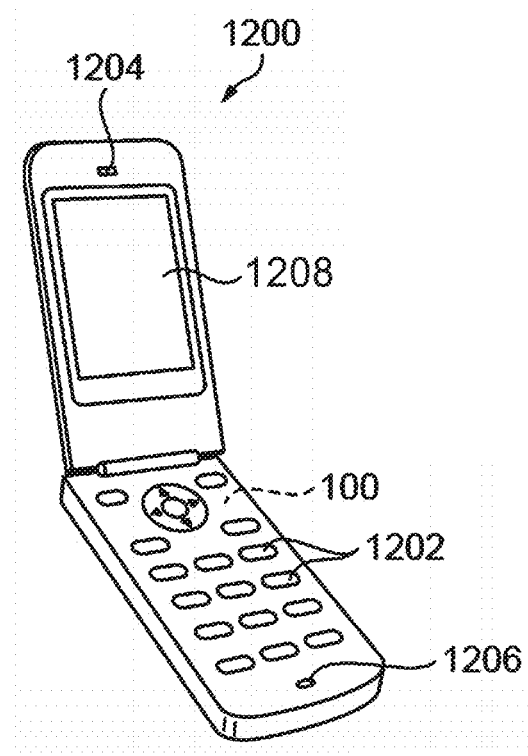
FIG. 11 is a perspective view schematically showing an electronic apparatus according to the third embodiment.

FIG. 11 is a perspective view schematically showing a cellular phone (including a PHS) 1200 as the electronic apparatus according to the third embodiment.

As shown in FIG. 11, the cellular phone 1200 includes a plurality of operation buttons 1202, an ear piece 1204 and a mouth piece 1206. A display section 1208 is arranged between the operation buttons 1202 and the ear pieces 1204.

The functional device 100 is incorporated in the cellular phone 1200.

Figure 12:
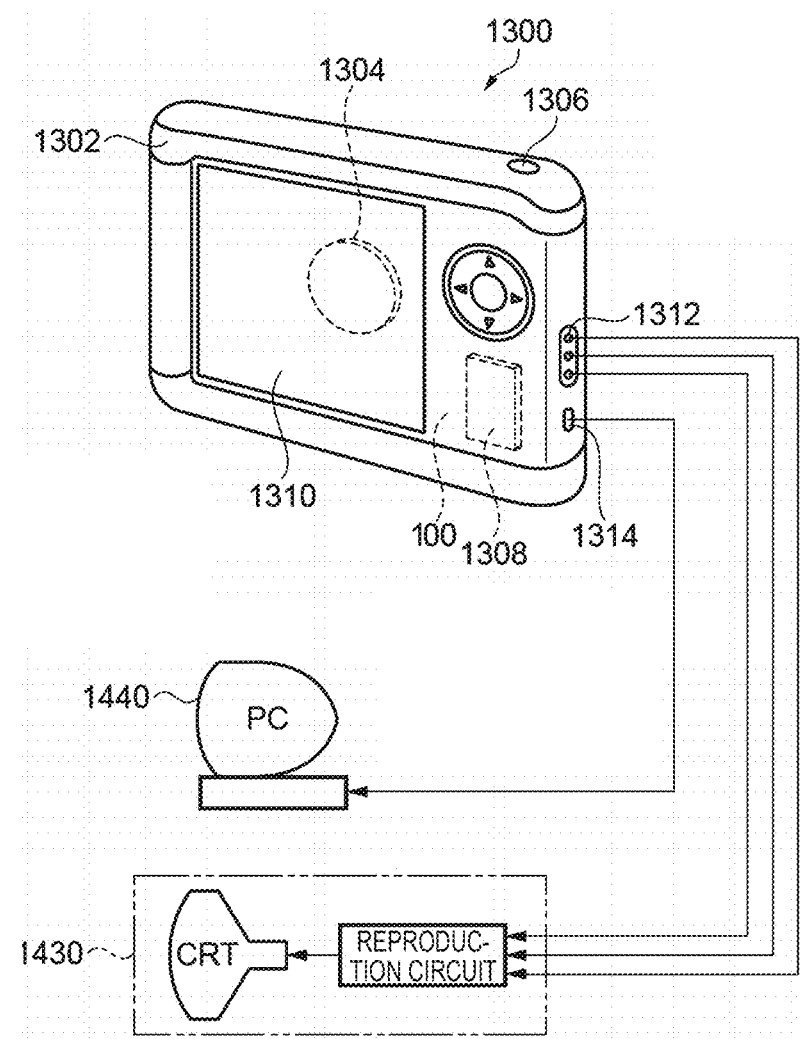
FIG. 12 is a perspective view schematically showing an electronic apparatus according to the third embodiment.

FIG. 12 is a perspective view schematically showing a digital still camera 1300 as the electronic apparatus according to the third embodiment. In FIG. 12, connection to an external apparatus is also briefly shown.

Whereas a normal camera exposes a silver salt photograph film with a light image of an object, the digital still camera 1300 photoelectrically converts the light image of the object with an imaging device such as a CCD (Charge Coupled Device) to generate an imaging signal (an image signal).

A display section 1310 is provided on the back of a case (a body) 1302 in the digital still camera 1300 and configured to perform display on the basis of the imaging signal generated by the CCD. The display section 1310 functions as a finder that displays the object as an electronic image.

On the front side (the rear side in the figure) of the case 1302, a light receiving unit 1304 including an optical lens (an imaging optical system) and a CCD is provided.

When a photographer checks an object image displayed on the display section 1310 and depresses a shutter button 1306, an imaging signal of the CCD at that point is transferred to and stored in a memory 1308.

In the digital still camera 1300, a video signal output terminal 1312 and an input/output terminal 1314 for data communication are provided on a side surface of the caser 1302. A television monitor 1430 and a personal computer 1440 are respectively connected to the video signal output terminal 1312 and the input/output terminal 1314 for data communication according to necessity. Further, the imaging signal stored in the memory 1308 is output to the television monitor 1430 and the personal computer 1440 by predetermined operation.

The functional device 100 is incorporated in the digital still camera 1300.

Since the electronic apparatuses 1100, 1200, and 1300 include the functional device 100, the electronic apparatuses 1100, 1200, and 1300 can accurately detect a physical quantity.

Besides the personal computer (the mobile personal computer) shown in FIG. 10, the cellular phone shown in FIG. 11, and the digital still camera shown in FIG. 12, the electronic apparatus including the functional device 100 can also be applied to an inkjet-type discharge apparatus (e.g., an inkjet printer), a laptop personal computer, a television, a video camera, a video tape recorder, various navigation apparatuses, a pager, an electronic notebook (including an electronic notebook with a communication function), an electronic dictionary, an electronic calculator, an electronic game machine, a head mounted display, a word processor, a work station, a video phone, a security television monitor, an electronic binocular, a POS terminal, medical apparatuses (e.g., an electronic thermometer, a sphygmomanometer, a blood sugar meter, an electrocardiogram apparatus, an ultrasonic diagnostic apparatus, and an electronic endoscope), a fish finder, various measuring apparatuses, meters (e.g., meters for a vehicle, an airplane, a rocket, and a ship), posture control for a robot, a human body, and the like, a flight simulator, and the like.

4. Fourth Embodiment

A moving object according to a fourth embodiment is explained with reference to the drawings. The moving object according to the fourth embodiment includes the physical quantity sensor according to the invention. A moving object including the functional device 100 as the physical quantity sensor according to the invention is explained below.

Figure 13:
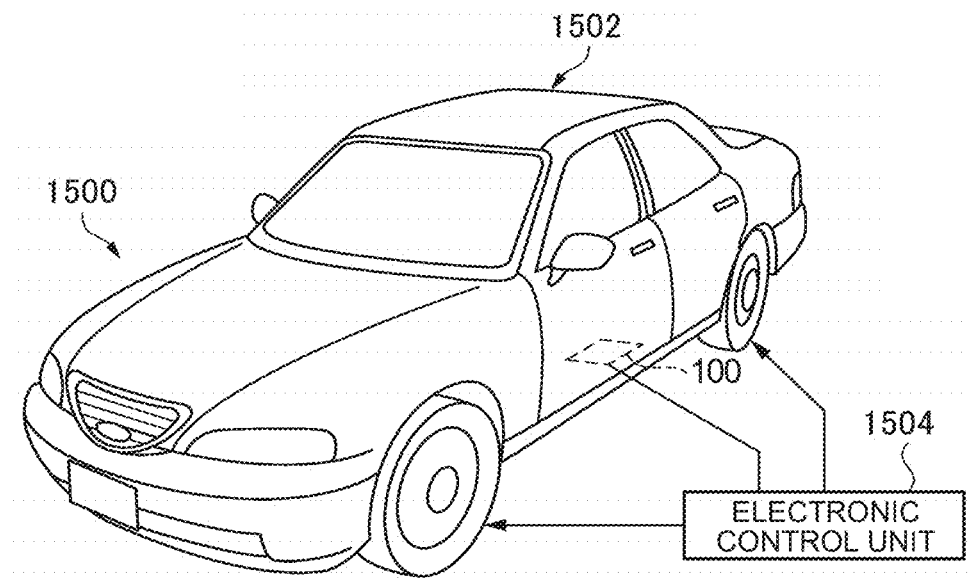
FIG. 13 is a perspective view schematically showing a moving object according to a fourth embodiment.

FIG. 13 is a perspective view schematically showing an automobile 1500 as the moving object according to the fourth embodiment.

The functional device 100 is incorporated in the automobile 1500. Specifically, as shown in FIG. 13, an electronic control unit (ECU) 1504 incorporating the functional device 100, which detects acceleration of the automobile 1500, and configured to control an output of an engine is mounted on a vehicle body 1502 of the automobile 1500. Besides, the functional device 100 can be widely applied to a vehicle body posture control unit, an anti-lock brake system (ABS), an air bag, and a tire pressure monitoring system (TPMS).

Since the automobile 1500 includes the functional device 100, the automobile 1500 can accurately detect a physical quantity.

The embodiments and the modifications explained above are examples. The invention is not limited to the embodiments and the modifications. For example, the embodiments and the modifications can be combined as appropriate.

The invention includes components substantially the same as the components explained in the embodiments (e.g., components having the same functions, methods, and results or components having the same purposes and effects). The invention includes components in which non-essential portions of the components explained in the embodiments are replaced. The invention includes components that can realize action and effects or attain objects same as those of the components explained in the embodiments. The invention includes components in which publicly-known techniques are added to the components explained in the embodiments.

What is claimed is:

1. A functional device comprising:
    a movable body displaceable along a first axis;
    a fixed section configured to support the movable body;
    a coupling section located between the movable body and the fixed section that couples the movable body to the fixed section, the coupling section having a plurality of interconnected beams that meander back and forth betweeen the movable body and the fixed section;
    a movable electrode section extending from the movable body;
    a fixed electrode section arranged to be opposed to the movable electrode section; and
    an extending section extending from the fixed section and including an opposed section opposed to a side surface of the movable electrode section, wherein
    a distance between the opposed section and the movable electrode section is smaller than a distance between the fixed electrode section and the movable electrode section.

2. The functional device according to claim 1, wherein
    a plurality of the movable electrode sections are provided along the first axis, and
    a distance between the opposed section and the movable electrode section opposed to the opposed section is smaller than a distance between the fixed electrode section and the other movable electrode sections.

3. The functional device according to claim 1, wherein a plurality of the movable electrode sections are provided along the first axis, and
a width of the movable electrode section opposed to the opposed section is larger than a width of the other movable electrode sections.

4. The functional device according to claim 1, wherein a protrusion section is provided in the opposed section of the extending section.

5. The functional device according to claim 1, wherein the extending section includes:
a first portion extending from the fixed section along a second axis that crosses the first axis; and
a second portion extending from the first portion in a direction of the first axis and including the opposed section at an end.

6. The functional device according to claim 1, wherein the fixed section, the extending section, the coupling section, the movable electrode section, and the movable body are integrally provided.

7. The functional device according to claim 1, wherein the extending section includes a portion opposed to a distal end face of the movable electrode section.

8. The functional device according to claim 1, wherein the coupling section includes:
a first coupling section arranged on one side across the first axis; and
a second coupling section arranged on the other side, and
the movable body is provided to extend between the first coupling section and the second coupling section.

9. The functional device according to claim 8, wherein a distance between an end of an extending portion of the movable body and an end of the fixed section is set smaller than the distance between the fixed electrode section and the movable electrode section.

10. The functional device according to claim 1, wherein the movable electrode section includes:
a first movable electrode section extending from one end of the movable body along a second axis that crosses the first axis; and
a second movable electrode extending from the other end on an opposite side of the one end, and
the functional device further comprises:
a first extending section extending from the fixed section and including a first opposed section opposed to a side surface of the first movable electrode section; and
a second extending section extending from the fixed section and including a second opposed section opposed to a side surface of the second movable electrode section.

11. The functional device according to claim 1, wherein the fixed section includes a first fixed section and a second fixed section,
the movable body is supported by the first fixed section and the second fixed section,
a second coupling section located between the movable body and the second fixed section that couples the movable body to the second fixed section, and
the movable electrode section includes:
a first movable electrode section extending from one end of the movable body along a second axis that crosses the first axis; and
a second movable electrode section extending from the other end on an opposite side of the one end, and
the functional device further comprises:
a first extending section functioning as the extending section, the first extending section extending from the first fixed section and including a first opposed section opposed to a side surface of the first movable electrode; and
a third extending section functioning as the extending section, the third extending section extending from the second fixed section in an opposite direction of the first extending section and including a third opposed section opposed to a side surface of the second movable electrode section.

12. The functional device according to claim 2, wherein a plurality of the movable electrode sections are provided along the first axis, and
width of the movable electrode section opposed to the opposed section is larger than width of the other movable electrode sections.

13. The functional device according to claim 2, wherein a protrusion section is provided in at least one of the opposed section of the extending section and a portion of the movable electrode section opposed to the opposed section.

14. The functional device according to claim 3, wherein a protrusion section is provided in at least one of the opposed section of the extending section and a portion of the movable electrode section opposed to the opposed section.

15. The functional device according to claim 2, wherein the extending section includes:
a first portion extending from the fixed section along a second axis that crosses the first axis; and
a second portion extending from the first portion in a direction of the first axis and including the opposed section at an end.

16. The functional device according to claim 3, wherein the extending section includes:
a first portion extending from the fixed section along a second axis that crosses the first axis; and
a second portion extending from the first portion in a direction of the first axis and including the opposed section at an end.

17. The functional device according to claim 4, wherein the extending section includes:
a first portion extending from the fixed section along a second axis that crosses the first axis; and
a second portion extending from the first portion in a direction of the first axis and including the opposed section at an end.

18. An electronic apparatus comprising the functional device according to claim 1.

19. A moving object comprising the functional device according to claim 1.

* * * * *